United States Patent
Shin et al.

(10) Patent No.: US 7,902,048 B2
(45) Date of Patent: Mar. 8, 2011

(54) METHOD OF FORMING A PHASE CHANGE LAYER AND METHOD OF MANUFACTURING A STORAGE NODE HAVING THE PHASE CHANGE LAYER

(75) Inventors: Woong-chul Shin, Yongin-si (KR); Jae-ho Lee, Yongin-si (KR); Youn-seon Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 310 days.

(21) Appl. No.: 11/976,130

(22) Filed: Oct. 22, 2007

(65) Prior Publication Data
US 2008/0108175 A1    May 8, 2008

(30) Foreign Application Priority Data
Oct. 20, 2006    (KR) .................... 10-2006-0102463

(51) Int. Cl.
*H01L 21/20* (2006.01)

(52) U.S. Cl. .............. 438/483; 438/95; 257/E21.462; 257/E21.201; 257/E21.666; 427/255.35; 427/255.19

(58) Field of Classification Search ........... 438/95, 438/483; 427/255.35, 255.19, 255.36; 257/E21.462, 257/E21.201, E21.666
See application file for complete search history.

(56) References Cited

U.S. PATENT DOCUMENTS

| | | | |
|---|---|---|---|
| 6,087,674 A * | 7/2000 | Ovshinsky et al. | 257/2 |
| 6,242,771 B1 * | 6/2001 | Hsu et al. | 257/295 |
| 7,207,848 B2 * | 4/2007 | Fukatsu et al. | 439/752 |
| 2002/0132721 A1 * | 9/2002 | Li et al. | 501/137 |
| 2006/0172067 A1 * | 8/2006 | Ovshinsky et al. | 427/248.1 |
| 2009/0275723 A1 * | 11/2009 | Ionkin et al. | 528/51 |

OTHER PUBLICATIONS

M. Perego, et al "Fabrication of GeO2 layers using a divalent Ge precursor", Applied Physics Letters, vol. 90, (Apr. 16, 2007), p. 162115(3 pages).*
M. Perego et al "Fabrication of GeO2 layers using a divalent Ge precursor" Applied Physics Letters, vol. 90 (2007), pp. 162115-1-162115-3.*

* cited by examiner

*Primary Examiner* — Caridad M Everhart
(74) *Attorney, Agent, or Firm* — Harness, Dickey & Pierce, PLC

(57) ABSTRACT

A method of forming a phase change layer may include providing a bivalent first precursor having germanium (Ge), a second precursor having antimony (Sb), and a third precursor having tellurium (Te) onto a surface on which the phase change layer is to be formed. The phase change layer may be formed by CVD (e.g., MOCVD, cyclic-CVD) or ALD. The composition of the phase change layer may be varied by modifying the deposition pressure, deposition temperature, and/or supply rate of reaction gas. The deposition pressure may range from about 0.001-10 torr, the deposition temperature may range from about 150-350° C., and the supply rate of the reaction gas may range from about 0-1 slm. Additionally, the above phase change layer may be provided in a via hole and bounded by top and bottom electrodes to form a storage node.

7 Claims, 5 Drawing Sheets

METHOD OF FORMING A PHASE CHANGE LAYER AND METHOD OF MANUFACTURING A STORAGE NODE HAVING THE PHASE CHANGE LAYER

PRIORITY STATEMENT

This application claims priority under 35 U.S.C. §119(a) to Korean Patent Application No. 10-2006-0102463, filed on Oct. 20, 2006 in the Korean Intellectual Property Office (KIPO), the entire contents of which are incorporated herein by reference.

BACKGROUND

1. Technical Field

Example embodiments relate to a method of forming a phase change layer and a method of manufacturing a storage node having the phase change layer.

2. Description of the Related Art

The resistance of a phase change material may vary depending to whether the phase change material is in a crystalline state or in an amorphous state. Additionally, the phase change material may change from a crystalline state to an amorphous state, and vice versa, depending on temperature. A phase change memory device may include a phase change layer made of the above-described phase change material as a means for storing bit data. An example of a phase change memory device may include a PRAM (phase change random access memory), and an example of a phase change material may include $Ge_2Sb_2Te_5$ (GST). A GST layer may be formed using a physical vapor deposition (PVD) method. However, controlling the growth of the GST layer may be difficult when using a PVD method. Additionally, deposition speed may be relatively low, and the density of the GST layer may be decreased. Accordingly, a metal organic chemical vapor deposition (MOCVD) method or a cyclic chemical vapor deposition cyclic-CVD) method may be used to obtain an improved GST layer.

A conventional method of forming a GST layer using a conventional CVD method will be briefly described. A substrate, including a layer on which a GST layer is to be formed, may be loaded into a CVD chamber. The substrate may be heated to the appropriate temperature for deposition. Precursors, including metal elements forming the GST layer, may be supplied simultaneously through a shower head to the heated substrate. For example, suitable precursors may be organic metal compounds including germanium (Ge), antimony (Sb), and/or tellurium (Te). As the substrate is heated to the appropriate temperature for deposition, the precursors may decompose and be absorbed onto the layer as a result of the reaction of metallic elements of the precursors with the layer. The precursors not reacted or absorbed onto the layer may be discharged from the CVD chamber.

SUMMARY OF EXAMPLE EMBODIMENTS

Example embodiments provide a method of forming a phase change layer and a method of manufacturing a storage node having the phase change layer. The method of forming a phase change layer may include providing a bivalent first precursor having germanium (Ge), providing a second precursor, and/or providing a third precursor onto a surface on which the phase change layer is to be formed using a deposition process. Additionally, the second precursor may have antimony (Sb), and the third precursor may have tellurium (Te). Furthermore, the phase change layer may be a $Ge_2Sb_2Te_5$ (GST) layer.

The deposition process may be performed using chemical vapor deposition (CVD), which may include metal organic chemical vapor deposition (MOCVD) and cyclic chemical vapor deposition (cyclic-CVD). The deposition process may also be performed using atomic layer deposition (ALD). The composition (e.g., Ge, Sb, Te content) of the phase change layer may be controlled by regulating the deposition pressure, the deposition temperature, and/or the supply rate of reaction gas. The deposition pressure may range from about 0.001-10 torr. The deposition temperature may range from about 150-350° C., and the supply rate of the reaction gas may range from about 0-1 slm. The first, second, and/or third precursors may be provided simultaneously, sequentially, or a combination thereof. Additionally, reaction gas may be provided during deposition.

The first precursor may be selected from the group consisting of $GeCl_2$, $Ge(N(SiMe_3)_2)_2$, $Ge(N(Me_3)_2)_2$, $Ge(CH(SiMe_3)_2)_2$, $Ge(CH(Me_3)_2)_2$, $Ge(Cp)_2$, and $Ge(EtCp)_2$, wherein Me, Et, Cp, and denote methyl, ethyl, and cyclopentadienyl, respectively. The second precursor may be $Sb(iPr)_3$, and the third precursor may be $Te(iPr)_2$, wherein iPr denotes isopropyl. Additionally, the reaction gas may be hydrogen ($H_2$).

$Ge(N(SiMe_3)_2)_2$, example first bivalent precursor, may be made by preparing $GeCl_2$.dioxane. Bis(trimethylsilyl)amine, anhydrous tetrahydrofuran (THF), and an equivalent amount of methyl lithium with respect to bis(trimethylsilyl)amine may be combined to form a solution. Half of the equivalent amount of the $GeCl_2$.dioxane with respect to the bis(trimethylsilyl)amine may be added to the solution to form $Ge(N(SiMe_3)_2)_2$ and a lithium chloride byproduct. The lithium chloride byproduct may be filtered and removed, and the THF may be removed by vaporizing the THF (e.g., decompression).

The above phase change layer may be provided in a storage node. The method of manufacturing a storage node having the above phase change layer may include providing a bottom electrode layer and an insulating interlayer on the bottom electrode layer, the insulating interlayer having a via hole above the bottom electrode layer. The above phase change layer may be formed on the bottom electrode layer by filling the via hole and/or formed on the insulating interlayer surrounding the via hole. A top electrode may be provided on the phase change layer.

By forming a phase change (e.g., GST) layer with a CVD or ALD process using a temperature of about 300° C. or lower, increased step coverage may be achieved. Thus, a via hole having a diameter of about 100 nm or less may be filled with a GST layer, and the reset current of the PRAM may be reduced. Consequently, the transistor size may be reduced, thereby increasing the integration of the PRAM.

BRIEF DESCRIPTION OF THE DRAWINGS

The scope of example embodiments will become more apparent when viewed together with the accompanying drawings. It should be noted that the thickness of layers or region illustrated in the drawings may have been exaggerated for clarity.

DETAILED DESCRIPTION OF EXAMPLE EMBODIMENTS

Figure 1:
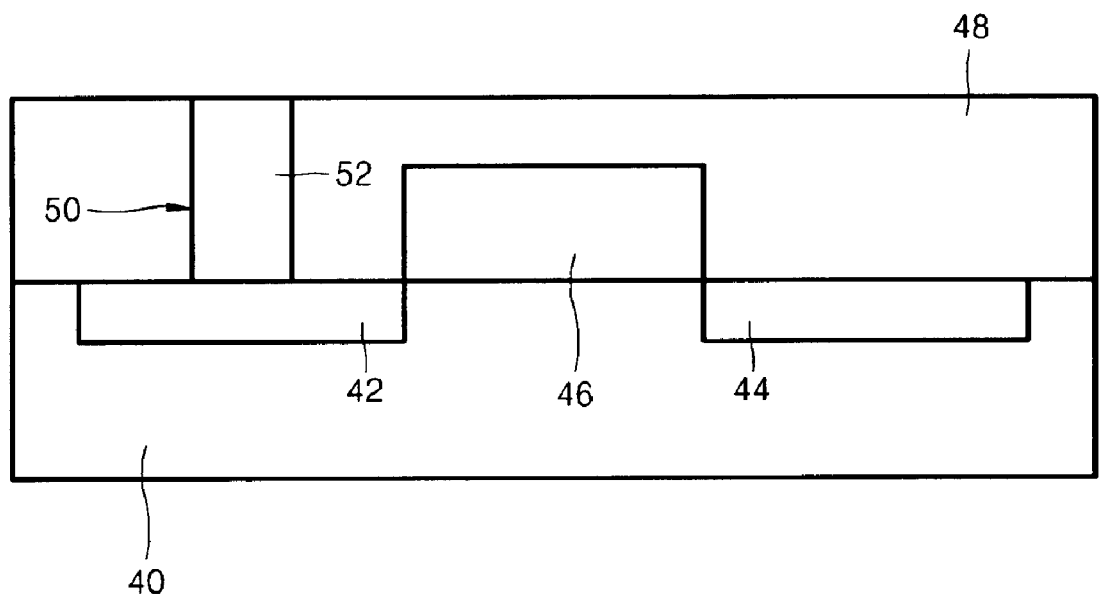
FIGS. 1 through 4 are cross-sectional views illustrating a method of manufacturing a phase change memory device including a storage node having a phase change layer according to example embodiments, wherein the phase change layer is provided in a via hole.

Example embodiments will be described below in more detail with reference to the accompanying drawings. However, example embodiments may be embodied in different forms and should not be interpreted as limited to the examples set forth herein.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Referring to FIG. 1, a gate stack 46 may be provided in an area of an active region defined by a device separation layer (not shown) on a p-type or an n-type substrate 40. The gate stack 46 may include a gate insulating layer (not shown) and a gate electrode (not shown). A first impurity region 42 and a second impurity region 44 may be provided in the substrate 40 between the device separation layer (not shown) and the gate stack 46. The first and second impurity regions 42 and 44, respectively, may be formed by ion-injecting doping materials having a conductivity opposite to the doping material of the substrate 40. The first impurity region 42 may be used as a source, and the second impurity region 44 may be used as a drain, or vice versa. The first and second impurity regions 42 and 44, respectively, may have a variety of shapes. The first and second impurity regions 42 and 44, respectively, and the gate stack 46 may constitute a semiconductor transistor.

A first insulating interlayer 48 may cover the first and second impurity regions 42 and 44, respectively, and the gate stack 46. A contact hole 50 exposing the first impurity region 42 may be provided in the first insulating interlayer 48. Alternatively, the contact hole 50 may be provided in the first insulating interlayer 48 to expose the second impurity region 44 instead of the first impurity region 42. The contact hole 50 may be filled with a conductive plug 52.

Figure 2:
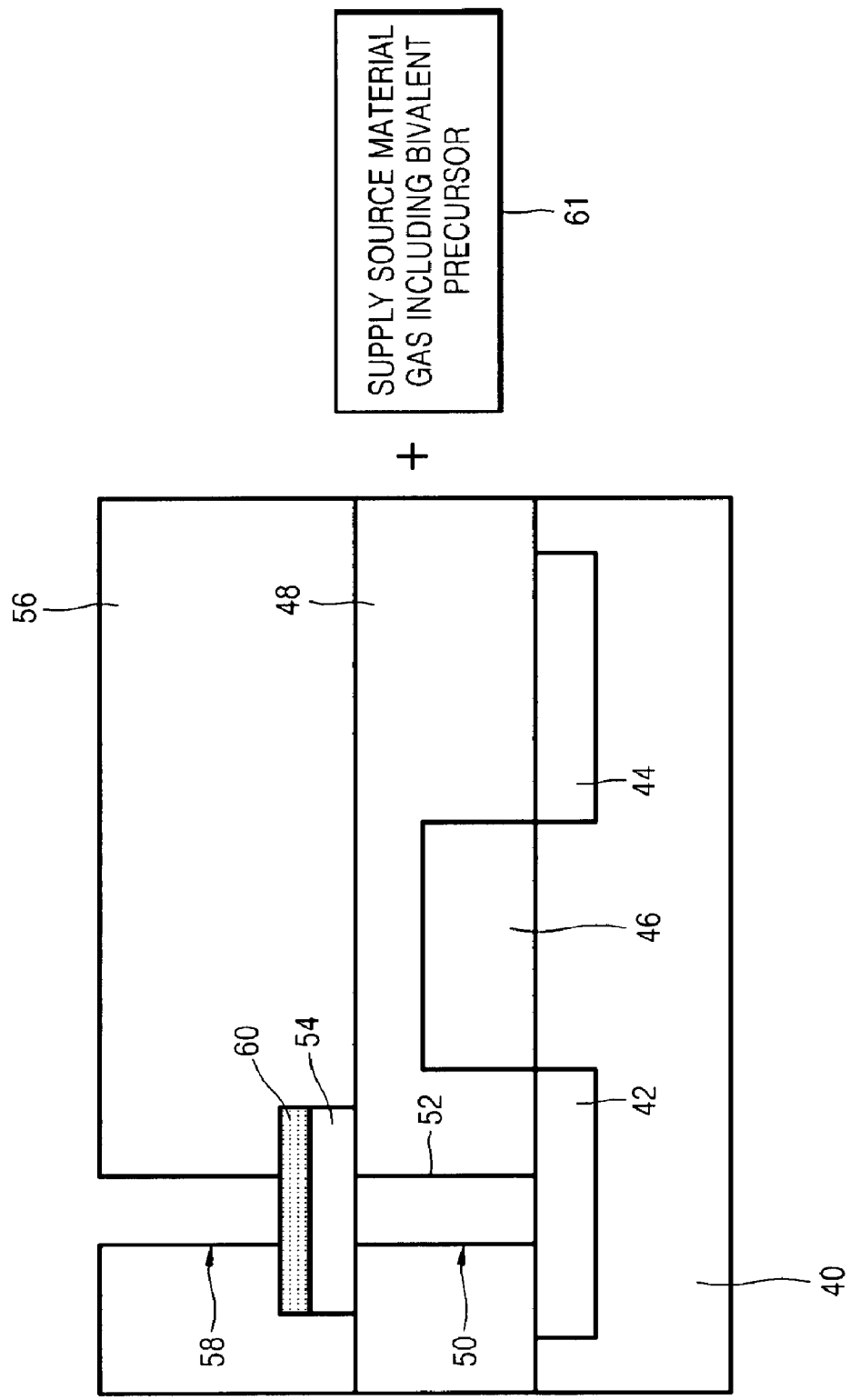
Figure 3:
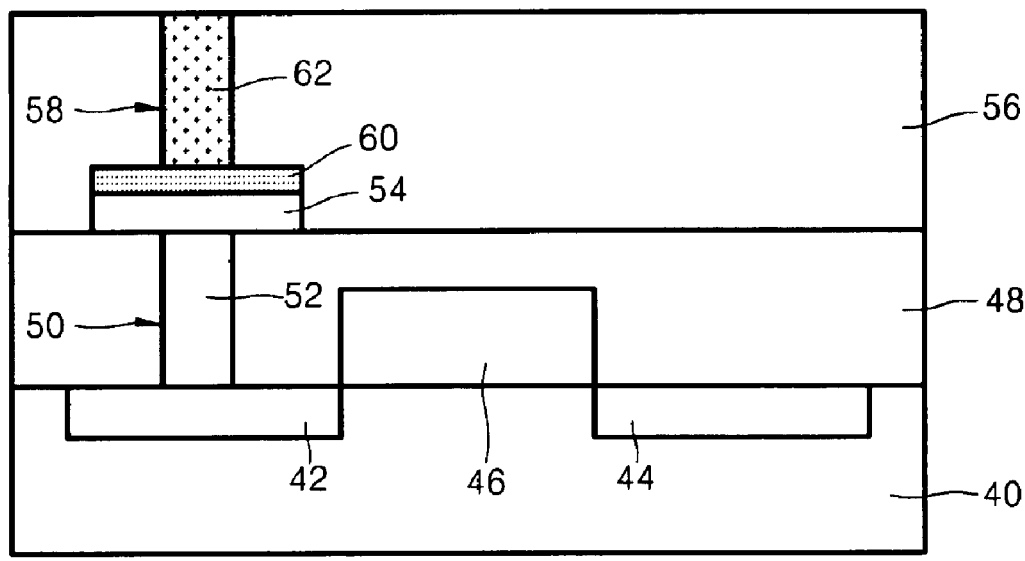

Referring to FIG. 2, a bottom electrode layer 54 may be provided on the first insulating interlayer 48 so as to cover an exposed upper surface of the conductive plug 52, and a bottom electrode contact layer 60 may be provided on the bottom electrode layer 54. The bottom electrode layer 54 and the bottom electrode contact layer 60 may be formed by sequentially stacking and simultaneously etching the bottom electrode layer 54 and the bottom electrode contact layer 60. A second insulating interlayer 56 may be provided on the first insulating interlayer 48 so as to cover the bottom electrode layer 54 and the bottom electrode contact layer 60. The second insulating interlayer 56 may be made of the same material (e.g., silicon oxide) as the first insulating interlayer 48. A via hole 58 may be provided on the second insulating interlayer 56 so as to expose an upper surface of the bottom electrode contact layer 60. A source material gas 61 including a bivalent precursor may be supplied to the second insulating interlayer 56 during a deposition process. Accordingly, a phase change layer 62 may be formed on the second insulating interlayer 56 so as to also fill the via hole 58. The phase change layer 62 may be planarized using a planarization method (e.g., chemical mechanical polishing (CMP)) until the second insulating interlayer 56 is exposed and the only remaining phase change layer 62 is in the via hole 58, as illustrated in FIG. 3.

Figure 4:
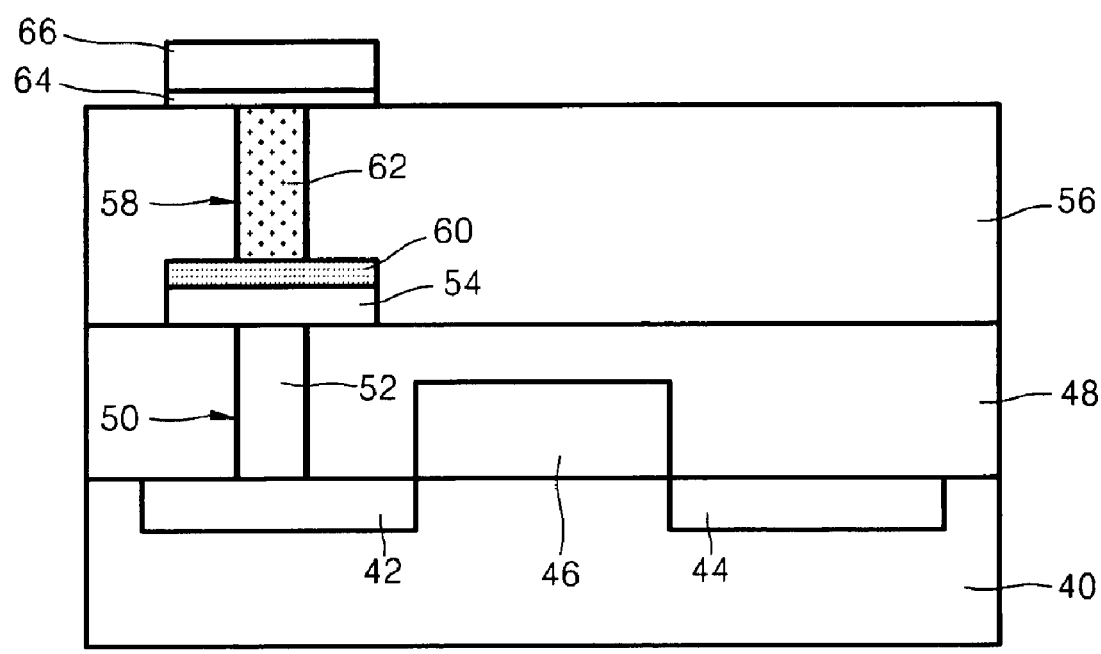
Figure 5:
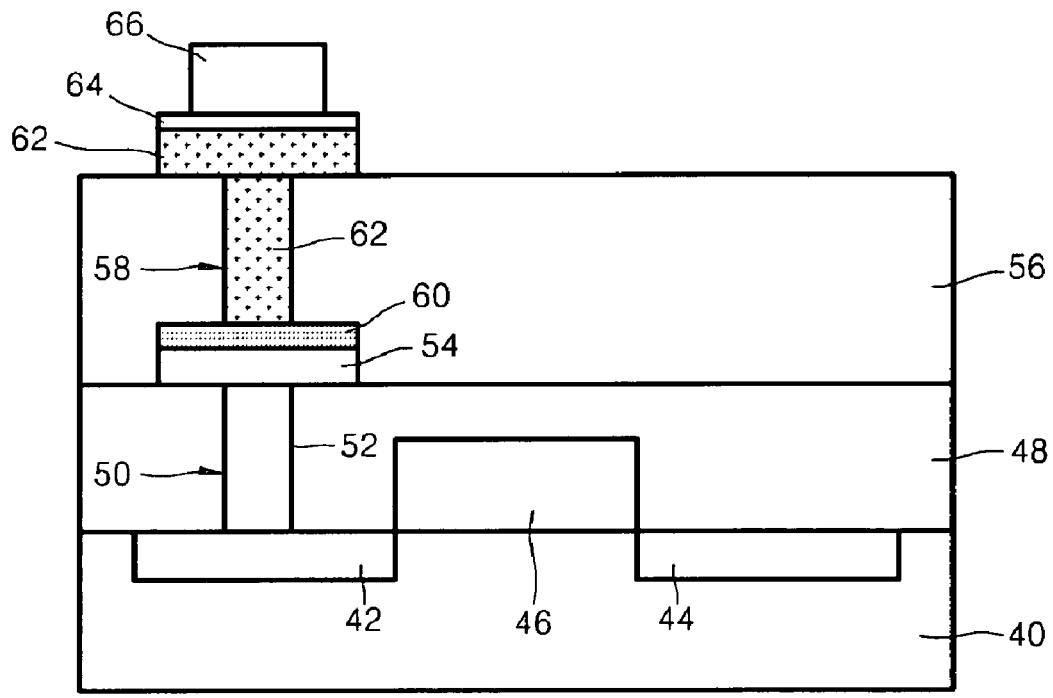
FIG. 5 is a cross-sectional view illustrating a phase change memory device including a storage node having a phase change layer according to example embodiments, wherein the phase change layer is provided in a via hole and on the second insulating interlayer surrounding a via hole.

Referring to FIG. 4, a top electrode contact layer 64 may be provided on the second insulating interlayer 56 so as to cover the phase change layer 62 in the via hole 58, and a top electrode layer 66 may be provided on the top electrode contact layer 64, thus forming a storage node. Alternatively, referring to FIG. 5, the phase change layer 62 may be formed to a desired thickness and etched so as to additionally cover a portion of the second insulating interlayer 56 surrounding the via hole 58. A top electrode contact layer 64 may be provided on the phase change layer 62 and a top electrode layer 66 may be provided on the top electrode contact layer 64 to form a storage node.

The phase change layer 62 may be formed using a CVD method or an atomic layer deposition (ALD) method. Examples of the CVD method may include MOCVD and cyclic-CVD. For example, during CVD, a substrate 40 having the second insulating interlayer 56 and via hole 58 may be placed in a deposition chamber and supplied with source material gases 61, a transportation gas, and a reaction gas (e.g., $H_2$). Alternatively, when the phase change layer 62 is formed by ALD, the $H_2$ gas may be omitted from the gas mixture including the source material gases 61.

The first, second, and third precursors may be provided simultaneously during deposition (e.g., MOCVD). Alternatively, one of the second precursor or third precursor may be simultaneously provided with the first precursor (e.g., cyclic-CVD, ALD). The first, second, and/or third precursors may also be provided sequentially by providing a precursor and purging the unabsorbed precursor prior to providing the next precursor. Alternatively, the unabsorbed first precursor may be purged prior to providing the second and third precursors. In any event, a precursor that has been supplied but not absorbed may be purged. When ALD is used, reaction gas may be supplied after purging an unabsorbed precursor. The deposition pressure may be maintained at about 0.001-10 torr, and the deposition temperature may be maintained at about 150-350° C. The supply rate of the $H_2$ gas may be maintained at about 0-1000 sccm (~1 slm).

Where the phase change layer 62 is a GST layer, the source material gas may include a first precursor including Ge, a second precursor including Sb, and a third precursor including Te. The first, second, and third precursors may be organic metal compounds, and the first precursor may additionally be a bivalent compound. The first precursor may be at least one of $GeCl_2$, $Ge(N(SiMe_3)_2)_2$, $Ge(N(Me_3)_2)_2$, $Ge(CH(SiMe_3)_2)_2$, $Ge(CH(Me_3)_2)_2$, $Ge(Cp)_2$, and $Ge(EtCp)_2$, wherein Me, Et, and Cp denote methyl, ethyl, and cyclopentadienyl, respectively. The second and third precursors may be $Sb(iPr)_3$ and $Te(iPr)_2$, respectively, wherein iPr denotes isopropyl.

$Ge(N(SiMe_3)_2)_2$, an example first bivalent precursor, may be made by preparing $GeCl_2$.dioxane. Bis(trimethylsilyl)amine, anhydrous tetrahydrofuran (THF), and an equivalent amount of methyl lithium with respect to bis(trimethylsilyl)amine may be combined to form a solution. Half of the equivalent amount of the $GeCl_2$.dioxane with respect to the bis(trimethylsilyl)amine may be added to the solution to form $Ge(N(SiMe_3)_2)_2$ and a lithium chloride byproduct. The lithium chloride byproduct may be filtered and removed, and the THF may be removed by vaporizing the THF (e.g., decompression).

The above-described synthesis of $Ge(N(SiMe_3)_2)_2$ may be represented by the following chemical formula.

[Formula]

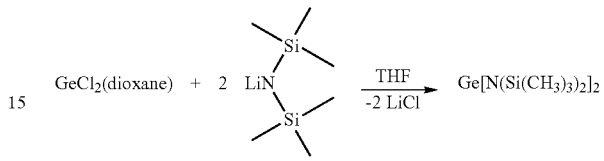

Figure 6:
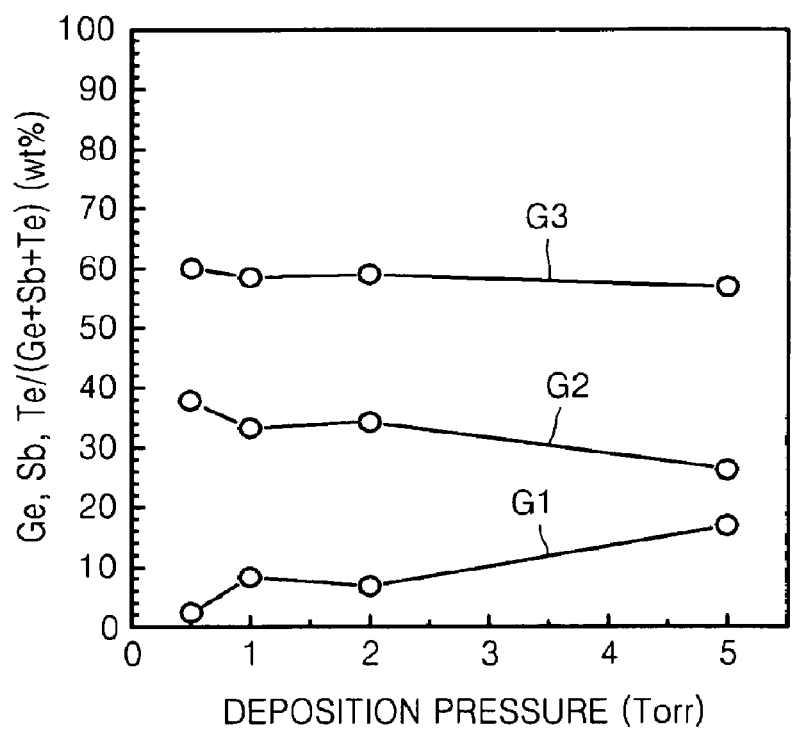
FIGS. 6 through 8 are graphs showing the variation of the composition of GST layers based on pressure, temperature, and hydrogen gas supply rate, respectively, according to example embodiments.
Figure 7:
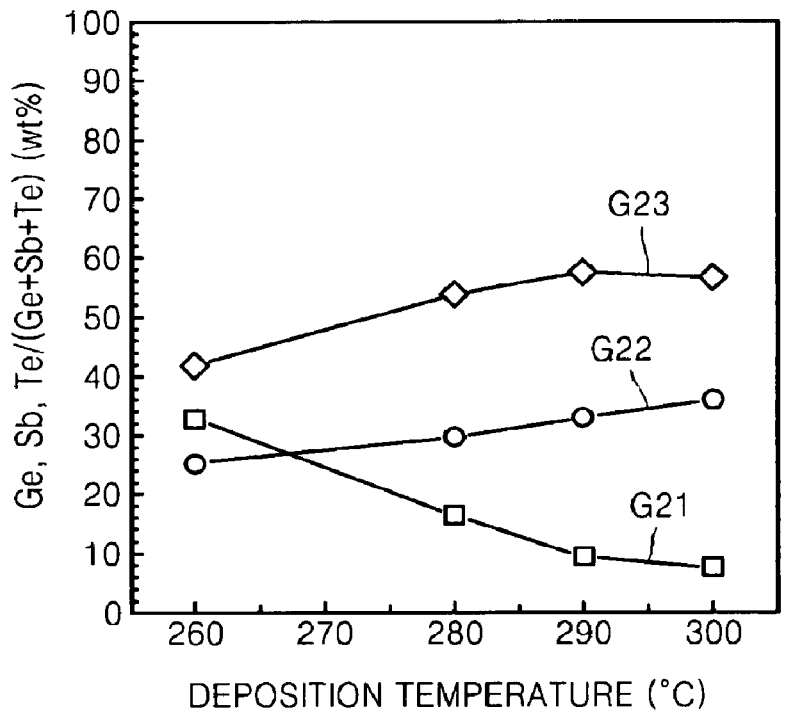
Figure 8:
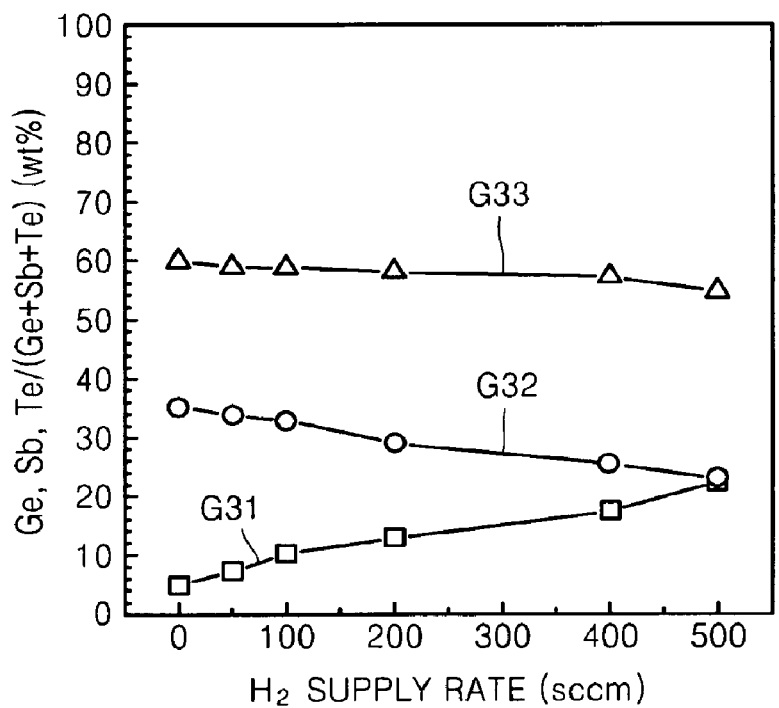

Referring to FIGS. 6 through 8, experiments were performed to determine the affect of various process factors on the Ge, Sb, and Te content of a GST layer. $Ge(N(SiMe_3)_2)_2$, $Sb(iPr)_3$, and $Te(iPr)_2$ were used as the first, second, and third precursors, respectively, in the experiments.

In a first experiment, as illustrated in FIG. 6, deposition pressure was varied from about 0-5 torr during the formation of a GST layer while keeping temperature and reaction gas supply rate constant at about 280° C. and about 400 sccm, respectively. Referring to FIG. 6, plots G1, G2, and G3 show the content of Ge, Sb, and Te, respectively, in the GST layer. As illustrated in FIG. 6, when deposition pressure was varied from about 0-5 torr, the content of Ge increased by about 20 wt %, the content of Sb decreased by about 15-20 wt %, and the content of Te remained at about 60 wt %.

In a second experiment, as illustrated in FIG. 7, deposition temperature was varied from about 260-300° C. during the formation of a GST layer while keeping pressure and reaction gas supply rate constant at about 5 torr and about 400 sccm, respectively. Referring to FIG. 7, plots G21, G22, and G23 show the content of Ge, Sb, and Te, respectively, in the GST layer. As illustrated in FIG. 7, when the deposition temperature was varied from about 260-360° C., the content of Ge decreased by about 30 wt %, the content of Sb increased by about 10 wt %, and the content of Te increased by about 15-20 wt %. It may be beneficial to use a deposition temperature of about 220-280° C.

In a third experiment, as illustrated in FIG. 8, $H_2$ gas supply rate was varied from about 0-500 sccm during the formation of a GST layer while keeping temperature and pressure constant at about 280° C. and about 5 torr, respectively. Referring to FIG. 8, plots G31, G32, and G33 show the content of Ge, Sb, and Te, respectively, in the GST layer. As illustrated in FIG. 8, when the $H_2$ gas supply rate was varied from about 0-500 sccm, the content of Ge increased by about 20 wt %, the content of Sb decreased by about 15 wt %, and the content of Te decreased by about 5 wt %.

In view of the results illustrated in FIGS. 6 through 8, it may be beneficial to form a GST layer using a deposition temperature of about 280° C., a deposition pressure of about 5 torr, and a $H_2$ gas supply rate of about 500 sccm.

Because a bivalent organic metal compound (e.g., Ge) may be used as a precursor in a CVD process (e.g., MOCVD, cyclic-CVD), the deposition temperature may be reduced to about 300° C. or lower, thus providing increased step coverage. As a result, a phase change layer (e.g., GST layer) may be used to fill a via hole having a diameter of about 100 nm or less. Accordingly, the reset current of a phase change memory device may be reduced, thereby reducing transistor size and increasing integration.

While example embodiments have been disclosed herein, other variations may be possible. Such variations are not to be regarded as a departure from the spirit and scope of example embodiments of the present invention, and all such modifications as would be obvious to one skilled in the art are intended to be included within the scope of the following claims.

What is claimed is:

1. A method of forming a phase change layer, comprising:
   providing a bivalent first precursor having germanium (Ge) onto a surface; and
   providing at least one of a second and third precursors onto the surface using a deposition process,
   wherein the second precursor is $Sb(iPr)_3$, wherein iPr denotes isopropyl.

2. A method of forming a phase change layer, comprising:
   providing a bivalent first precursor having germanium (Ge) onto a surface; and
   providing at least one of a second and third precursors onto the surface using a deposition process,
   wherein the third precursor is $Te(iPr)_2$, wherein iPr denotes isopropyl.

3. A method of forming a phase change layer, comprising:
   providing a bivalent first precursor having germanium (Ge) onto a surface; and
   providing at least one of a second and third precursors onto the surface using a deposition process,
   wherein the phase change layer is a $Ge_2Sb_2Te_5$ (GST) layer.

4. A method of manufacturing a storage node, comprising:
   providing a bottom electrode layer;
   providing an insulating interlayer on the bottom electrode layer, the insulating interlayer having a via hole above the bottom electrode layer;
   forming a phase change layer on at least one of the bottom electrode layer and the insulating interlayer, the bottom electrode layer and insulating interlayer each having a surface; and
   providing a top electrode layer on the phase change layer,
   wherein forming the phase change layer includes providing a bivalent first precursor having germanium (Ge) onto the surface of at least one of the bottom electrode layer and the insulating interlayer: and providing at least one of a second and third precursors onto the surface using a deposition process.

5. The method of claim 4, wherein the phase change layer is on an area of the insulating layer surrounding the via hole.

6. The method of claim 4, further comprising:
   providing a bottom electrode contact layer on the bottom electrode layer prior to providing the insulating interlayer, the bottom electrode contact layer having a surface.

7. The method of claim 4, further comprising:
   providing a top electrode contact layer on the phase change layer prior to providing the top electrode layer.

* * * * *